United States Patent
Udagawa (10) Patent No.: US 6,835,962 B2
(45) Date of Patent: Dec. 28, 2004

(54) STACKED LAYER STRUCTURE, LIGHT-EMITTING DEVICE, LAMP, AND LIGHT SOURCE UNIT

(75) Inventor: Takashi Udagawa, Saitama (JP)

(73) Assignee: Showa Denko Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/207,901

(22) Filed: Jul. 31, 2002

(65) Prior Publication Data

US 2003/0027099 A1 Feb. 6, 2003

Related U.S. Application Data

(60) Provisional application No. 60/323,084, filed on Sep. 19, 2001, provisional application No. 60/311,103, filed on Aug. 10, 2001, and provisional application No. 60/311,073, filed on Aug. 10, 2001.

(30) Foreign Application Priority Data

| Aug. 1, 2001 | (JP) | ................................ P2001-233428 |
| Aug. 2, 2001 | (JP) | ................................ P2001-235454 |
| Aug. 17, 2001 | (JP) | ................................ P2001-247523 |

(51) Int. Cl.$^7$ ............................................. H01L 33/00

(52) U.S. Cl. ...................... 257/97; 257/103; 257/190; 372/45

(58) Field of Search .................. 257/97, 103, 190, 257/22; 372/45

(56) References Cited

U.S. PATENT DOCUMENTS

| 5,042,043 A | * | 8/1991 | Hatano et al. ................. 372/45 |
| 6,194,744 B1 | * | 2/2001 | Udagawa et al. .............. 257/94 |
| 6,541,799 B2 | * | 4/2003 | Udagawa ..................... 257/94 |

FOREIGN PATENT DOCUMENTS

| JP | 2-288371 | 11/1990 |
| JP | 2-288388 | 11/1990 |
| JP | 4-297023 | 10/1992 |
| JP | 10-247745 | 9/1998 |
| JP | 11-260720 | 9/1999 |
| JP | 11-266006 | 9/1999 |
| JP | 11-346001 | 12/1999 |
| JP | 2000-22211 | 1/2000 |
| JP | 2001-053338 | 2/2001 |

* cited by examiner

Primary Examiner—Jerome Jackson
(74) Attorney, Agent, or Firm—Sughrue Mion, PLLC (57) ABSTRACT

A stacked layer structure including a single crystal substrate; an amorphous or polycrystalline buffer layer formed from a boron-containing Group III–V compound semiconductor. The buffer layer is provided on the substrate; a cladding layer formed from a boron-containing Group III–V compound semiconductor is provided on the buffer layer; and a light-emitting layer having a quantum well structure including a barrier layer formed from a boron-containing Group III–V compound semiconductor and a well layer formed from a Group III nitride semiconductor is provided on the cladding layer. The barrier layer is formed from a boron-containing Group III–V compound semiconductor having the same lattice constant as a boron-containing Group III–V compound semiconductor constituting the cladding layer.

13 Claims, 3 Drawing Sheets

STACKED LAYER STRUCTURE, LIGHT-EMITTING DEVICE, LAMP, AND LIGHT SOURCE UNIT

CROSS-REFERENCE TO RELATED APPLICATIONS

This application claims benefit of U.S. Provisional Application Nos. 60/311,103 and 60/311,073 filed Aug. 10, 2001, and No. 60/323,084 filed Sep. 19, 2001, incorporated herein by reference.

BACKGROUND OF THE INVENTION

1. Field of the Invention

The present invention relates to a stacked layer structure containing a light-emitting layer and having a quantum well structure including a barrier layer formed from a boron-containing Group III–V compound semiconductor.

2. Background Art

In general, the term "quantum well (QW) structure" refers to a superlattice structure in which thin barrier layers and well layers are stacked alternately and periodically (see "Fundamentals of Semiconductor Laser" edited by The Japan Society of Applied Physics, first printing, first edition, published by Ohmsha, Ltd. on May 20, 1987, pp. 140–146). The barrier layer serves as a layer for localizing carriers in the well layer, and the barrier layer is generally formed from a semiconductor material having a bandgap larger than that of a semiconductor material constituting the well layer (see the aforementioned "Fundamentals of Semiconductor Laser," page 140). A quantum well structure including only one well layer is called a "single quantum well (SQW) structure," and a quantum well structure including a plurality of periodically stacked well layers is called a "multi quantum well (MQW) structure" (see the aforementioned "Fundamentals of Semiconductor Laser," page 171). Conventionally, there has been disclosed a technique for forming a field effect transistor having a quantum well structure which can be operated at high speed by means of electrons which are localized in a well layer under the barrier effect of a barrier layer (see U.S. Pat. No. 4,163,237).

A technique has been known for forming a light-emitting device which emits light of short wavelength, such as a light-emitting diode (LED) which emits blue light or green light, or a laser diode (LD), which includes a light-emitting layer (active layer) having a quantum well structure (see "Group III Nitride Semiconductor," first edition, published by Baifukan Co., Ltd. on Dec. 8, 1999, pp. 247–252). Conventionally, in a single or multi quantum well structure formed of a well layer and a barrier layer, the well layer has generally been formed from gallium indium nitride ($Ga_x In_{1-x}N$: $0 \leq X \leq 1$) (see U.S. Pat. No. 6,153,894), and the barrier layer has generally been formed from aluminum gallium nitride ($Al_x Ga_{1-x}N$: $0 \leq X \leq 1$) (see U.S. Pat. No. 6,153,894).

A light-emitting layer having a single quantum well structure or multi quantum well structure has been provided conventionally on a cladding layer formed from a Group III nitride semiconductor such as p-type or n-type gallium nitride (GaN). Recently, a light-emitting diode (LED) including a substrate formed from single crystal silicon (Si), a cladding layer formed from a boron phosphide semiconductor, and a light-emitting layer provided on the cladding layer has been proposed.

Conventionally, a light-emitting diode including a light-emitting layer formed from gallium indium nitride ($Ga_x In_{1-x}N$: $0 \leq X \leq 1$) has been disclosed (see Japanese Patent Publication (kokoku) No. 55-3834), and a light-emitting diode including a light-emitting layer formed from a boron-containing Group III–V compound semiconductor of a multi-component mixed crystal has also been disclosed (see Japanese Patent Application Laid-Open (kokai) No. 10-247745). For example, a light-emitting layer having a superlattice structure containing $Ga_{0.25}Al_{0.3}B_{0.5}N_{0.5}P_{0.5}$ (i.e., a pentanary mixed crystal) and boron phosphide (BP) are known (see Japanese Patent Application Laid-Open (kokai) No. 10-247745).

When a light-emitting layer is formed of a superlattice-structure layer containing a boron-containing Group III–V compound semiconductor of a multi-component mixed crystal as described above, a special growth apparatus is required for attaining abrupt changes of composition at a junction interface between layers constituting a superlattice structure (see Japanese Patent Application Laid-Open (kokai) No. 2-288371). When the number of constitutive elements is reduced, a mixed crystal of a stable composition can be obtained more advantageously and conveniently (see "An Introduction to Semiconductor Device" authored by Iwao Teramoto, first edition, published by Baifukan Co., Ltd. on Mar. 30, 1995, page 24). In order to successfully obtain the aforementioned pentanary mixed crystal in which compositions of constitutive elements are constant, a sophisticated formation technique for, e.g., precisely adjusting the feed amounts of the elements is required, making the operation troublesome.

In the case of a conventional structure including a cladding layer formed from a boron phosphide Group III–V compound semiconductor and a light-emitting layer formed of a single layer of, for example, gallium indium nitride, the light-emitting layer being provided on the cladding layer, the half width of the wavelength of light emitted from the light-emitting layer is broad. Therefore, there has been demand for a light-emitting layer which emits light of high monochromaticity. The half width of the central wavelength (about 420 nm) of violet light emitted from a light-emitting layer formed from gallium indium nitride ($Ga_x In_{1-x}N$) (i.e., a conventional light-emitting layer) is as large as about 380 meV to about 400 meV.

When a light-emitting layer is constructed to have a quantum well structure rather than being formed to have a single layer, the light-emitting layer is well known to emit monochromatic light by virtue of attainment of uniform quantum level (see the aforementioned "Fundamentals of Semiconductor Laser," page 164). Also, when a light-emitting layer constituting a laser diode (LD) is formed of a quantum well structure, the threshold voltage (i.e., Vth) of the LD can be reduced (see the aforementioned "Fundamentals of Semiconductor Laser," pp. 173–178). However, it has not been known so far that a light-emitting layer of quantum well structure can be readily joined to a boron-containing Group III–V compound semiconductor layer and where the light-emitting layer can emit light of high monochromaticity.

SUMMARY OF THE INVENTION

In view of the foregoing, an object of the present invention is to provide a stacked layer structure comprising a single crystal substrate; an amorphous or polycrystalline buffer layer formed from a Group III–V compound semiconductor containing boron (B) (i.e., a boron-containing Group III–V compound semiconductor), the buffer layer being provided on the substrate; a cladding layer formed from a boron-containing Group III–V compound semiconductor, the cladding layer being provided on the buffer layer; and a light-emitting layer formed from a Group III–V compound semiconductor, the light-emitting layer being provided on the cladding layer. Another object of the present invention is to provide a light-emitting device comprising the stacked layer structure, which emits light of high monochromaticity. Yet another object of the present invention is to provide a lamp comprising the light-emitting device. A further object of the present invention is to provide a light source unit comprising the lamp.

A first aspect of the present invention, provides a stacked layer structure comprising a single crystal substrate; an amorphous or polycrystalline buffer layer formed from a Group III–V compound semiconductor containing boron (B) (i.e., a boron-containing Group III–V compound semiconductor), the buffer layer being provided on the substrate; a cladding layer formed from a boron-containing Group III–V compound semiconductor, the cladding layer being provided on the buffer layer; and a light-emitting layer having a quantum well structure including a barrier layer formed from a boron-containing Group III–V compound semiconductor and a well layer formed from a Group III nitride semiconductor, the light-emitting layer being provided on the cladding layer, wherein the barrier layer is formed from a boron-containing Group III–V compound semiconductor having the same lattice constant as the boron-containing Group III–V compound semiconductor constituting the cladding layer.

Since the light-emitting layer has the aforementioned quantum well structure, the layer emits light of high monochromaticity.

Preferably, the well layer is formed from a Group III nitride semiconductor having the same lattice constant as the boron-containing Group III–V compound semiconductor constituting the cladding layer.

Preferably, the well layer is formed from a semiconductor having the same lattice constant as the semiconductor constituting the barrier layer.

Preferably, the barrier layer is formed from boron gallium indium phosphide ($B_XGa_YIn_{1-X-Y}P$: $0 \leq X \leq 1$, $0<Y<1$, $0<X+Y \leq 1$).

Preferably, the buffer layer is formed from a boron-containing Group III–V compound semiconductor having a composition capable of establishing lattice matching with a single crystal material constituting the substrate.

Preferably, the cladding layer is formed of a boron-containing Group III–V compound semiconductor layer, and has a first surface that faces the buffer layer having a boron composition capable of establishing lattice matching with the buffer layer, and a second surface that faces the light-emitting layer having a boron composition capable of establishing lattice matching with the barrier layer or the well layer, wherein a boron compositional proportion is graduated in a thickness direction.

Preferably, the cladding layer is formed from boron gallium indium phosphide ($B_XGa_YIn_{1-X-Y}P$: $0<X \leq 1$, $0 \leq Y<1$, $0<X+Y \leq 1$).

Preferably, an intermediate layer formed from a Group III–V compound semiconductor is provided between the cladding layer and the light-emitting layer, the semiconductor containing an element which constitutes a Group III–V compound semiconductor constituting the light-emitting layer.

Since the intermediate layer is provided under the light-emitting layer, the light-emitting layer contains no microcracks; i.e., exhibits excellent continuity.

Preferably, the intermediate layer is formed from a Group III–V compound semiconductor capable of establishing lattice matching with a Group III–V compound semiconductor constituting the light-emitting layer.

Preferably, the intermediate layer is formed from the same Group III–V compound semiconductor as that constituting the light-emitting layer.

A second aspect of the present invention provides a light-emitting device comprising any of the stacked layer structures of the present invention.

The light-emitting device comprising the stacked layer structure emits light of high intensity and high monochromaticity.

A third aspect of the present invention provides a lamp comprising the light-emitting device.

The lamp comprising the light-emitting device emits light of high intensity and high monochromaticity.

A fourth aspect of the present invention provides a light source unit comprising the lamp.

The light source unit comprising the lamp emits light of high intensity and high monochromaticity.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which.

DETAILED DESCRIPTION OF THE INVENTION

Figure 1:
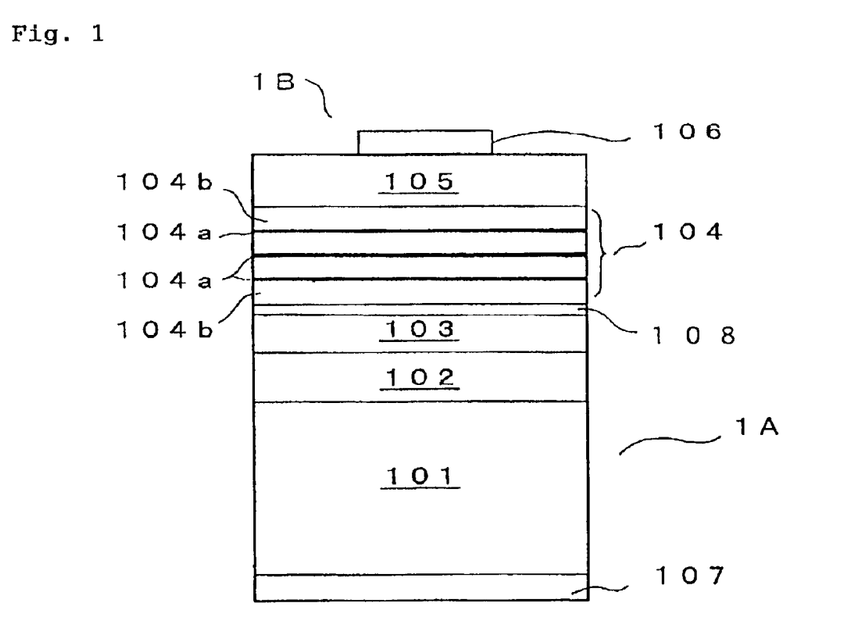
FIG. 1 is a schematic cross-sectional view showing an LED according to the present invention.

An embodiment of the present invention will next be described with reference to a stacked layer structure 1A for an LED shown in FIG. 1. A characteristic feature of the stacked layer structure 1A resides in that the structure 1A includes a light-emitting layer (active layer) 104 having a quantum well structure.

A substrate 101 of the stacked layer structure 1A may be formed from single crystal silicon or from a single crystal Group III–V compound semiconductor, such as gallium phosphide (GaP), gallium arsenide (GaAs), or boron phosphide (BP) (see (1) J. Electrochem. Soc., 120 (1973), pp. 802–806, and (2) U.S. Pat. No. 5,042,043). The crystalline plane orientation of the surface of a single crystal material constituting the substrate 101 may be selected from among {101}, {110}, and {111}. When the substrate 101 is formed from an electrically conductive crystalline material, a positive or negative ohmic electrode 107 can be provided on the bottom surface of the substrate 101, and thus a light-emitting diode can readily be formed. Particularly, when the substrate 101 is formed from an electrically conductive single crystal material having a resistivity as low as 10 mΩ·cm or less (preferably 1 mΩ·cm or less), the conductive substrate 101 enables production of an LED having a low forward voltage (i.e., Vf). Since the conductive substrate 101 exhibits excellent heat radiation ability, the substrate 101 is effectively employed for producing an LD exhibiting reliable radiation.

A buffer layer 102 is provided on the single crystal substrate 101, in order to promote formation of a continuous cladding layer 103. When the buffer layer 102 is formed from a boron-containing Group III–V compound semiconductor containing an element which constitutes a boron-containing Group III–V compound semiconductor constituting the cladding layer 103, under the effect of the element serving as a "nucleus for growth," formation of the continuous cladding layer 103 can be promoted. The buffer layer 102 may be formed from a boron-containing Group III–V compound semiconductor; for example, a boron-phosphide-based semiconductor represented by the following formula: $B_\alpha Al_\beta Ga_\gamma In_{1-\alpha-\beta-\gamma} P_{1-\delta} As_\delta$ ($0<\alpha\leq 1$, $0\leq\beta<1$, $0\leq\gamma<1$, $0<\alpha+\beta+\gamma\leq 1$, $0\leq\delta<1$). Alternatively, the buffer layer 102 may be formed from a nitrogen (N)-containing boron-phosphide-based semiconductor represented by the following formula: $B_\alpha Al_\beta Ga_\gamma In_{1-\alpha-\beta-\gamma} P_{1-\delta} N_\delta$ ($0<\alpha\leq 1$, $0\leq\beta<1$, $0\leq\gamma<1$, $0<\alpha+\beta+\gamma\leq 1$, $0<\delta<1$). Preferably, the buffer layer 102 is formed from a binary crystal or a ternary mixed crystal, which contains a few kinds of elements and has a simple structure. For example, the buffer layer 102 is preferably formed from boron monophosphide (BP), a boron aluminum phosphide mixed crystal ($B_\alpha Al_\beta P$: $0<\alpha\leq 1$, $\alpha+\beta=1$), a boron gallium phosphide mixed crystal ($B_\alpha Ga_\gamma P$: $0<\alpha\leq 1$, $\alpha+\gamma=1$), or a boron indium phosphide mixed crystal ($B_\alpha In_{1-\alpha} P$: $0<\alpha\leq 1$).

When the cladding layer 103 is in lattice mismatching with the single crystal material constituting the substrate 101, the buffer layer 102 is preferably formed of an amorphous or polycrystalline boron-containing Group III–V compound semiconductor layer. The resultant amorphous or polycrystalline buffer layer 102 exerts the effect of relaxing lattice mismatching between the substrate 101 and a layer constituting the stacked layer structure 1A, thereby reducing the density of crystalline defects, such as misfit dislocation, of the layer constituting the stacked layer structure 1A. For example, the buffer layer 102 is formed from polycrystalline boron phosphide (BP) (see U.S. Pat. No. 6,069,021). An amorphous or polycrystalline semiconductor layer which is suitably employed for forming the buffer layer 102; for example, a $B_\alpha Al_\beta Ga_\gamma In_{1-\alpha-\beta-\gamma} P_{1-\delta} As_\delta$ ($0<\alpha\leq 1$, $0\leq\beta<1$, $0\leq\gamma<1$, $0<\alpha+\beta+\gamma\leq 1$, $0\leq\delta<1$), can be formed through, for example, a MOCVD method (see Inst. Phys. Conf. Ser., No. 129 (IOP Publishing Ltd., 1993), pp.157–162) at a relatively low film formation temperature of 250° C. to 750° C. (see U.S. Pat. No. 6,194,744 B1). At a temperature of about 500° C. or less, an amorphous boron-containing Group III–V compound semiconductor layer tends to be formed. At a temperature of about 500° C. to 750° C., a polycrystalline boron-containing Group III–V compound semiconductor layer is predominantly formed. In general, when an as-grown amorphous buffer layer is heated to 750° C. to about 1,200° C., the amorphous buffer layer is converted to a polycrystalline layer. Diffraction pattern analysis through a conventional technique, such as X-ray diffraction or electron diffraction technique, reveals whether the buffer layer 102 is an amorphous layer or a polycrystalline layer. The thickness of an amorphous layer or a polycrystalline layer which constitutes the buffer layer 102 is preferably about 1 nm to 100 nm inclusive, more preferably 2 nm to 50 nm inclusive.

When the buffer layer 102 is formed from a material capable of establishing lattice matching with a single crystal material constituting the substrate 101, lattice mismatching between the single crystal substrate 101 and a layer constituting the stacked layer structure 1A (e.g., the cladding layer 103) is relaxed, and thus a superior-quality cladding layer 103 and light-emitting layer 104 with reduced crystalline defects attributed to lattice misfit are obtained. Examples of the semiconductor material capable of establishing lattice matching with silicon (lattice constant: about 5.431 Å) include boron gallium phosphide ($B_{0.02}Ga_{0.98}P$, lattice constant: about 5.431 Å). The buffer layer 102 capable of establishing lattice matching with a single crystal GaP (lattice constant: about 5.450 Å) substrate can be formed from, for example, boron gallium arsenide ($B_{0.23}Ga_{0.77}As$, lattice constant: about 5.450 Å) (see Japanese Patent Application Laid-Open (kokai) No. 2000-22211).

The cladding layer 103 formed from a boron-containing Group III–V compound semiconductor is provided on the buffer layer 102. The cladding layer 103 may be formed from, for example, a boron-containing Group III–V compound semiconductor represented by the following formula: $B_{60} Al_\beta Ga_\gamma In_{1-\alpha-\beta-\gamma} P_{1-\delta} As_\delta$ ($0<\alpha\leq 1$, $0\leq\beta<1$, $0\leq\gamma<1$, $0<\alpha+\beta+\gamma\leq 1$, $0\leq\delta<1$); or $B_{60} Al_\beta Ga_\gamma In_{1-\alpha-\beta-\gamma} P_{1-\delta} N_\delta$ ($0<\alpha\leq 1$, $0\leq\beta<1$, $0\leq\gamma<1$, $0<\alpha+\beta+\gamma\leq 1$, $0<\delta<1$). When the cladding layer 103, serving as an underlying layer of the light-emitting layer 104, is formed of a boron-containing Group III–V compound semiconductor layer such that a first surface of the cladding layer 103 that faces the buffer layer 102 establishes lattice matching with the layer 102 and that a second surface of the cladding layer 103 that faces the light-emitting layer 104 establishes lattice matching with the layer 104, the density of crystalline defects, including misfit dislocation and stacking fault, can be reduced in the light-emitting layer 104; i.e., the light-emitting layer 104 exhibits good quality. The cladding layer 103 capable of establishing lattice matching with the buffer layer 102 and the light-emitting layer 104 may be formed of a boron-containing Group III–V compound semiconductor layer in which the composition of a Group III element or a Group V element is graduated (see Japanese Patent Application Laid-Open (kokai) No. 2000-22211). The composition of an element constituting the semiconductor layer is increased or decreased in a thickness direction in a linear manner, a stepwise manner, or a non-linear manner. The cladding layer 103 is preferably formed from boron gallium indium phosphide ($B_\alpha Ga_\beta In_{1-\alpha-\beta} P$: $0<\alpha\leq 1$, $0\leq\beta<1$, $0<\alpha+\beta\leq 1$), which can establish lattice matching with single crystal silicon. For example, the cladding layer 103, which is formed on the buffer layer 102 formed from a boron gallium phosphide mixed crystal ($B_{0.02}Ga_{0.98}P$) capable of establishing lattice matching with the silicon substrate 101, may be a boron gallium phosphide ($B_\alpha Ga_\delta P$) layer in which the boron compositional proportion ($\alpha$) is increased proportionally from 0.02 to 0.98 (as $\delta$ is correspondingly decreased from 0.98 to 0.02) in a direction from a surface of the layer that faces the buffer layer 102 toward a surface of the layer that faces a well layer 104a formed from gallium indium nitride ($Ga_{0.90}In_{0.10}N$, lattice constant: about 4.557 Å).

The cladding layer 103 is particularly preferably formed of a boron-phosphide (BP)-based semiconductor layer containing, as a matrix, boron phosphide (BP) having a band gap of 3.0±0.2 eV at room temperature. For example, the cladding layer 103 is preferably formed from a boron gallium phosphide mixed crystal ($B_{0.50}Ga_{0.50}P$) having a band gap of about 2.7 eV at room temperature, the mixed crystal being formed of boron monophosphide (band gap at room temperature: 3.0 eV) and gallium phosphide (GaP, band gap at room temperature: about 2.3 eV). A cladding layer containing a boron-phosphide-based semiconductor having a wide band gap at room temperature can be formed by appropriately adjusting the growth rate and the ratio between the amounts of source materials to be fed within specific ranges. The growth rate of the cladding layer is preferably 2 nm/minute to 30 nm/minute inclusive. When the input ratio of the amount of a Group V source to that of a Group III source (i.e., V/III ratio) is adjusted so as to fall within a specific range (preferably 15 to 60) while the growth rate is maintained within the above range, the cladding layer can be formed. The band gap of a boron-phosphide-based semiconductor is obtained on the basis of, for example, photon-energy dependence of an imaginary number portion of a complex dielectric constant ($\epsilon_2 = 2 \cdot n \cdot k$) calculated by use of refractive index (n) and extinction coefficient (k).

The light-emitting layer 104 has a single or multi quantum well structure. A well layer 104a which constitutes the quantum well structure is formed of, for example, a layer formed from a nitrogen-containing Group III–V compound semiconductor (Group III nitride semiconductor), such as gallium indium nitride ($Ga_X In_{1-X} N$: $0 \leq X \leq 1$) which emits visible light of short wavelength (e.g., near-ultraviolet light, blue light, or green light), or gallium nitride phosphide ($GaN_{1-X}P_X$: $0 \leq X \leq 1$). The well layer 104a formed from $GaN_{1-X}P_X$ ($0 \leq X \leq 1$) can emit near-ultraviolet light to red light, by virtue of non-linear change of band gap which depends on the compositional proportion (X) of phosphorus (P) (see Appl. Phys. Lett., 60 (20) (1992), pp. 2540–2542).

In the present invention, a barrier layer 104b which constitutes the quantum well structure is formed from a boron-containing Group III–V compound semiconductor. For example, the barrier layer 104b may be formed of a layer of a boron-containing Group III–V compound semiconductor such as boron indium phosphide ($B_\alpha In_{1-\alpha} P$: $0 < \alpha \leq 1$) which can be formed at substantially the same temperature as that required for forming the well layer 104a from $Ga_X In_{1-X} N$ ($0 \leq X \leq 1$) or $GaN_{1-X}P_X$ ($0 \leq X \leq 1$). Therefore, thermal damage inflicted on the well layer 104a can be reduced, and thermal degradation of crystallinity of the well layer 104a can be prevented. Thus, the light-emitting layer 104 is advantageously formed of a quantum well structure including a high-quality well layer.

The barrier layer 104b is formed from a boron-containing Group III–V compound semiconductor material having a band gap larger than that of a semiconductor material constituting the well layer 104a. Preferably, the barrier layer 104b is formed from a boron-containing Group III–V compound semiconductor having a band gap about 0.1 eV or more (more preferably 0.2 eV) larger than that of a semiconductor constituting the well layer 104a. For example, when the well layer 104a is formed from a cubic gallium indium nitride mixed crystal ($Ga_{0.60}In_{0.40}N$) having a band gap of about 2.8 eV at room temperature, the barrier layer 104b is formed from boron monophosphide (BP) having a band gap of 3.0 eV at room temperature. The greater the difference in band gap between a semiconductor constituting the well layer 104a and a boron-containing Group III–V compound semiconductor constituting the barrier layer 104b, the more effectively carriers are confined in the well layer 104a. As a result, the quantum level of the well layer 104a becomes higher, and the light-emitting layer emits light of shorter wavelength.

In the present invention, the quantum well structure includes the well layer 104a and the barrier layer 104b, which are joined directly to each other. Alternatively, the quantum well structure may be formed of a stacked layer structure such as a GRIN-SCH structure, in order to attain moderate change of band gap between the well layer 104a and the barrier layer 104b. For example, such a stacked layer structure can be formed by providing a layer of a boron-containing Group III–V compound semiconductor having a band gap larger than that of a semiconductor constituting the well layer 104a and smaller than that of a semiconductor constituting the barrier layer 104b. Provision of such a boron-containing Group III–V compound semiconductor layer attains sufficient confinement of emission in the thin well layer 104a.

In the case where the light-emitting layer 104 having a quantum well structure is provided on the cladding layer 103, when the barrier layer 104b is formed from a semiconductor having the same lattice constant as the boron-containing Group III–V compound semiconductor constituting the cladding layer 103, and the barrier layer 104b is joined to the cladding layer 103 capable of establishing lattice matching with the barrier layer 104b, a barrier layer 104b with excellent crystallinity can be obtained. Provision of the barrier layer 104b having excellent crystallinity with reduced crystalline defect density attributed to lattice mismatching contributes to formation of a light-emitting layer having a quantum well structure of good quality. When the barrier layer 104b joined to the cladding layer 103 is formed from a boron-containing Group III–V compound semiconductor having a band gap equal to or less than that of a semiconductor constituting the cladding layer 103 and having a band gap larger than that of a semiconductor constituting the well layer 104a, for example, the forward voltage of the LED is regulated suitably. Preferably, the cladding layer 103 is formed from, for example, a boron gallium phosphide mixed crystal ($B_{0.90}Ga_{0.10}P$, band gap: about 2.93 eV), and the barrier layer 104b is formed from, for example, a boron indium phosphide mixed crystal ($B_{0.93}In_{0.07}P$, band gap: about 2.88 eV).

When the well layer 104a constituting the light-emitting layer is formed from a Group III nitride semiconductor having the same lattice constant as the boron-containing Group III–V compound semiconductor constituting the cladding layer, and the well layer 104a is joined to the cladding layer 103 capable of establishing lattice matching with the well layer 104a, a well layer 104a with excellent crystallinity can be obtained. When the density of crystal defects attributed to lattice mismatching is reduced in the well layer 104a, and the layer 104a exhibits excellent crystallinity, the light-emitting layer contributes to formation of a quantum well structure of good quality. Preferably, the cladding layer 103 is formed from, for example, a boron indium phosphide mixed crystal ($B_{0.91}In_{0.09}P$, lattice constant: about 4.651 Å), and the well layer 104a is formed from, for example, a gallium indium nitride mixed crystal ($Ga_{0.70}In_{0.30}N$, lattice constant: about 4.651 Å). In the case where either the well layer 104a or the barrier layer 104b is joined to the cladding layer 103, the forward voltage (i.e., Vf) of a light-emitting diode (LED) can be reduced, when a functional layer for moderately reducing barrier difference is provided between the cladding layer 103, and the well layer 104a or the barrier layer 104b (see Japanese Patent No. 2992933). In addition, the threshold voltage (Vth) of a laser diode (LD) is effectively reduced.

When the well layer 104a is joined directly to the cladding layer 103, the cladding layer 103 is formed from a boron-containing Group III–V compound semiconductor having a band gap larger than that of a semiconductor constituting the well layer 104a. When the well layer 104a is formed of a multi-phase structure, including a subsidiary phase containing quantum-dot-like micro crystals and a primary phase which predominantly constitutes crystal layers and which has a band gap larger than that of the secondary phase (see Japanese Patent No. 3090063),the cladding layer 103 is preferably formed from a boron-containing Group III–V compound semiconductor material having a band gap larger than that of the primary phase.

Boron monophosphide (BP) is a zinc-blende-type cubic crystal having a lattice constant of about 4.538 Å (see the aforementioned "An Introduction to Semiconductor Device," page 28). Therefore, when the cladding layer 103 is formed from boron monophosphide having a lattice constant nearly equal to that (about 4.510 Å) of cubic gallium nitride (GaN), a gallium nitride layer predominantly containing cubic GaN can be formed on the cladding layer 103. Meanwhile, the lattice spacing between crystal planes {110} of boron monophosphide is about 3.209 Å, and is nearly equal to the a-axis lattice constant (3.180 Å) of hexagonal wurtzite gallium nitride. Therefore, a hexagonal gallium nitride (GaN) layer exhibiting excellent crystallinity can be formed on the cladding layer 103 formed from boron monophosphide. Depending on the formation temperature, either one of a cubic GaN layer or a hexagonal GaN layer is preferentially formed. When the formation temperature is higher than 750° C. and about 1,000° C. or less, a cubic gallium nitride layer tends to be formed. When the formation temperature exceeds 1,000° C., a hexagonal GaN layer is preferentially formed. When the well layer 104a joined directly to the BP cladding layer 103 is formed from GaN, the well layer 104a having either a cubic or a hexagonal structure type can be formed.

When the quantum well structure is formed of the well layer 104a formed from a Group III nitride semiconductor and of the barrier layer 104b formed from a boron-containing Group III–V compound semiconductor, the Group III nitride semiconductor having the same lattice constant as the Group III–V compound semiconductor; i.e., the well layer 104a capable of establishing lattice matching with the barrier layer 104b, a good-quality quantum well structure containing less crystal defects is obtained. Preferably, the well layer 104a is formed from, for example, a cubic gallium nitride phosphide mixed crystal (GaN$_{0.97}$P$_{0.03}$, lattice constant: about 4.538 Å), and the barrier layer 104b is formed from, for example, boron phosphide (BP, lattice constant: about 4.538 Å). Each of the well layer 104a and the barrier layer 104b may be formed from any of a cubic zinc-blende-type Group III–V compound semiconductor and a hexagonal wurtzite-type Group III–V compound semiconductor, so long as these Group III–V compound semiconductors have the same lattice constant. For example, the well layer 104a may be formed of a hexagonal semiconductor layer, and the barrier layer 104b may be formed of a cubic semiconductor layer. When both the well layer 104a and the barrier layer 104b are formed of cubic zinc-blende-type semiconductor layers, unlike the case of a conventional junction structure of hexagonal wurtzite-type semiconductor layers, reduction in band gap attributed to a piezoelectric field (see the aforementioned "Group III nitride semiconductor," pp. 289–290) can be prevented.

When the light-emitting layer 104 has a multi quantum well structure, light is more effectively confined as compared with the case where the layer 104 has a single quantum well structure (see the aforementioned "Fundamentals of Semiconductor Laser," page 143). When stacking units, each including a well layer 104a and a barrier layer 104b, are stacked periodically, a multi quantum well structure can be formed. The number of periodical stacking cycles is preferably at least 3, more preferably at least 5 and less than 10. The thickness of the well layer 104a falls within a range of about some nm to some tens of nm. The thickness of the well layer 104a is preferably about 30 nm or less. The barrier layer 104b has a sufficient thickness required for causing carriers to pass therethrough by means of the tunnel effect; i.e., about 50 nm or less. The smaller the thickness of the well layer 104a, the higher the quantum level of the well layer 104a. The quantum level of the well layer 104a is calculated on the basis of the Kronig-Penny model by use of the thickness of the well layer 104a as a parameter (see "Physics and Applications of Semiconductor Superlattice" edited by the Physical Society of Japan, first edition, fourth printing, published by Baifukan Co., Ltd. on Sep. 30, 1986, pp. 211–213).

The multi quantum well structure is formed of the well layer 104a and the barrier layer 104b, which are of the same conduction type. For example, the multi quantum well structure is formed by stacking n-type well layers 104a and n-type barrier layers 104b alternately and periodically. Examples of dopants for forming an n-type conductive boron-containing Group III–V compound semiconductor layer which constitutes the n-type barrier layer 104b include Group IV elements such as silicon (Si) and tin (Sn), and Group VI elements such as sulfur (S), selenium (Se), and tellurium (Te). Examples of p-type dopants include Group II elements such as zinc (Zn), magnesium (Mg), and beryllium (Be). The amount of a dopant to be added is preferably appropriately adjusted so as not to form a mixed crystal with materials constituting the well layer 104a and the barrier layer 104b (see the aforementioned "Physics and Applications of Semiconductor Superlattice," page 84). Regardless of the single or multi quantum well structure of the light-emitting layer 104, the well layer 104a is preferably formed of a high-purity undoped layer; i.e., a layer which is not intentionally doped with impurities.

In the present invention, an intermediate layer 108 is provided between the cladding layer 103 and the light-emitting layer 104. The intermediate layer 108 is formed from a Group III–V compound semiconductor containing an element constituting Ga$_X$In$_{1-X}$N ($0 \leq X \leq 1$) or GaN$_{1-X}$P$_X$ ($0 \leq X \leq 1$) which constitutes the light-emitting layer 104. Preferably, the intermediate layer 108 is formed from a Group III–V compound semiconductor containing a Group III element constituting the light-emitting layer 104. For example, the intermediate layer 108 is formed from aluminum gallium nitride (Al$_X$Ga$_{1-X}$N: $0 \leq X \leq 1$) containing gallium (Ga), which is a Group III element constituting GaN$_{1-X}$P$_X$ ($0 \leq X \leq 1$). When the intermediate layer 108 is formed from a Group III–V compound semiconductor having a band gap equal to or larger than that of a semiconductor constituting the light-emitting layer 104, absorption of light emitted from the light-emitting layer 104 can be advantageously avoided. For example, when the light-emitting layer 104 is formed from Ga$_X$In$_{1-X}$N ($0 \leq X \leq 1$), which has a band gap of 2.7 eV and emits blue light, the intermediate layer 108 is formed from gallium nitride (GaN) predominantly containing cubic crystals and having a band gap of about 3.2 eV.

An element which constitutes the light-emitting layer 104 and is contained in the intermediate layer 108; particularly, an element exposed to the surface of the intermediate layer 108, functions as an adsorption site for promoting formation of the light-emitting layer 104, and thus the resultant light-emitting layer 104 exhibits excellent continuity. Particularly when the intermediate layer 108 is formed from a semiconductor material having the same lattice constant as a semiconductor constituting the light-emitting layer 104, the intermediate layer 108 provides a "nucleus for growth" and exhibits good lattice matching with the light-emitting layer 104, whereby the resultant light-emitting layer 104 exhibits excellent continuity. In addition, the density of crystal defects attributed to lattice mismatching can be reduced in the light-emitting layer 104. When the light-emitting layer 104 is formed from, for example, cubic $Ga_{0.09}In_{0.10}N$ (lattice constant: about 4.557 Å), preferably, the intermediate layer 108 is formed from, for example, cubic gallium nitride arsenide ($GaN_{0.97}As_{0.03}$) having the same lattice constant as the cubic $Ga_{0.90}IN_{0.10}N$.

Particularly when the intermediate layer 108 and the light-emitting layer 104 are formed from the same material, the intermediate layer 108 provides adsorption sites which are regularly arranged in a manner similar to that of crystals contained in the light-emitting layer 104, and thus the light-emitting layer 104 contains no microcracks and exhibits excellent continuity. For example, when the light-emitting layer 104 is formed from $Ga_{0.80}In_{0.20}N$, the intermediate layer 108 is also formed from $Ga_{0.80}In_{0.20}N$. The intermediate layer 108 serves as an adsorption site, even when it has a thickness as small as one atomic layer. However, preferably, the intermediate layer 108 is formed so as to have a thickness of some nm to some hundreds of nm, so that the layer 108 can uniformly cover the surface of an underlying layer; for example, the cladding layer 103.

The terminal layer of the multi quantum well structure may be the well layer 104a or the barrier layer 104b. When an upper cladding layer 105 is provided on the top surface layer (i.e., the well layer 104a or the barrier layer 104b) of the quantum well structure constituting the light-emitting layer 104, a light-emitting part of double hetero (DH) structure can be formed. When the terminal layer of the quantum well structure is the well layer 104a, similar to the barrier layer 104b, the upper cladding layer 105 joined to the well layer 104a serves as a cladding layer for the well layer 104a. The upper cladding layer 105 is preferably formed from a boron-containing Group III–V compound semiconductor material, as in the case of the cladding layer 103 provided between the light-emitting layer 104 and the substrate 101. The upper cladding layer 105 is formed of an electrically conductive layer of a conduction type opposite that of the cladding layer 103. The conduction type of the upper cladding layer 105 may be the same as or opposite that of the well layer 104a constituting the light-emitting layer 104.

When the upper cladding layer 105 is formed from a semiconductor material capable of establishing lattice matching with the terminal layer (i.e., the well layer 104a or the barrier layer 104b) of the quantum well structure, for example, strain applied to the well layer 104a can be reduced, and the light-emitting layer 104 can maintain good crystallinity. Particularly, when the upper cladding layer 105 is formed from a semiconductor material which enables formation of the layer 105 at a temperature equal to or lower than the temperature required for forming the light-emitting layer 104, thermal damage to the light-emitting layer 104 can be reduced, and the quality of the light-emitting layer 104 can be maintained. As described above, a boron-containing Group III–V compound semiconductor layer can be formed at a temperature nearly equal to the formation temperature of, for example, a gallium indium nitride ($Ga_xIn_{1-x}N$) layer constituting the well layer 104a. Therefore, a boron-containing Group III–V compound semiconductor is suitably employed for forming the upper cladding layer 105.

In the present invention, preferably, the barrier layer 104b is formed from boron gallium phosphide ($B_xGa_{1-x}P$: $0 \leq X \leq 1$) or boron indium phosphide ($B_xIn_{1-x}P$: $0 \leq X \leq 1$). Each of the boron-containing Group III–V compound semiconductor materials is a ternary mixed crystal, and can be formed readily. Examples of the technique for forming the ternary mixed crystal include, in addition to the aforementioned MOCVD method, a boron trichloride ($BCl_3$)/phosphorus trichloride ($PCl_3$)/hydrogen ($H_2$)-reaction-system halide vapor grown method, and a diborane ($B_2H_6$)/phosphine ($PH_3$)/$H_2$-reaction-system hydride vapor grown method. Since the ternary mixed crystal can be formed at a temperature nearly equal to the formation temperature of the light-emitting layer 104, thermal impairment of the light-emitting layer 104 in a high-temperature atmosphere can be advantageously prevented. The cladding layer 103 and the upper cladding layer 105 may be formed from $B_xGa_{1-x}P$ ($0 \leq X \leq 1$) or $B_xIn_{1-x}P$ ($0 \leq X \leq 1$).

The cladding layer formed from a boron-containing Group III–V compound semiconductor according to the present invention serves as a layer for confining carriers and emission in the light-emitting layer of quantum well structure.

Next will be described a light-emitting device including the aforementioned stacked layer structure 1A. For example, an LED 1B of double hetero (DH) junction structure is produced by providing a top ohmic electrode 106 on the upper cladding layer 105 formed on the light-emitting layer 104 constituting the stacked layer structure 1A, and providing a bottom ohmic electrode 107 on the bottom surface of the substrate 101. When the substrate 101 is formed from an electrically conductive single crystal material, an ohmic electrode can be provided on the bottom surface of the substrate 101, and thus an electrode formation process for producing a light-emitting device can be, simplified. A p-type ohmic electrode to be provided on the upper cladding layer 105 formed from a boron-containing Group III–V compound semiconductor may be formed from, for example, a gold.zinc (Au.Zn) alloy or a gold.beryllium (Au.Be) alloy. Meanwhile, an n-type ohmic electrode may be formed from an alloy of gold, such as a gold.germanium (Au.Ge) alloy, a gold.indium (Au.In) alloy, or a gold.tin (Au.Sn) alloy. In order to form an electrode exhibiting good ohmic contact a contact layer of high electrical conductivity for forming the top ohmic electrode 106 may be provided on the upper cladding layer. A boron-containing Group III–V compound semiconductor layer of large band gap which is drawn to the present invention is suitably employed for forming a contact layer for providing the top ohmic electrode 106, which also serves as a window layer which allows emitted light to pass therethrough in a emission extraction direction.

Figure 2:
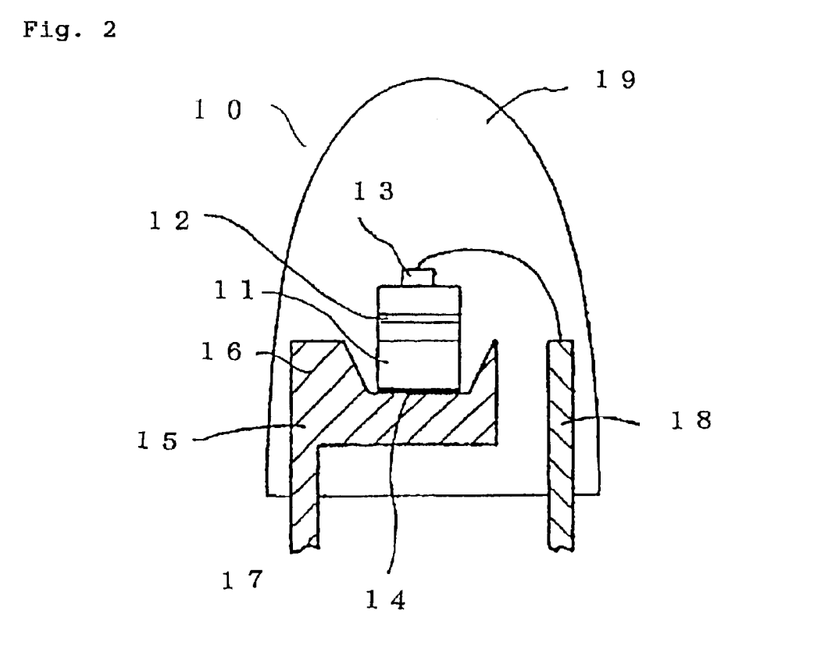
FIG. 2 is a schematic cross-sectional view showing a lamp according to the present invention.

Next, a lamp of high luminance including the aforementioned light-emitting device will be described. For example, a lamp 10 is produced through the following procedure. As shown in FIG. 2, an LED including a substrate 11 and a light-emitting layer 12 having the quantum well structure according to the present invention, the layer 12 being provided above the substrate 11, is secured, by use of an electrically conductive binder, on a center portion of a bowl-shaped cup 16 plated with a metal such as silver (Ag) or aluminum (Al), the cup 16 being provided on a pedestal 15. Thus, an electrode 14 provided on the bottom surface of the substrate 11 is electrically connected to a terminal 17 attached to the pedestal 15. An electrode 13 provided on an upper cladding layer is connected with a wire to another terminal 18. Subsequently, the bowl-shaped cup 16 is encapsulated with a typical epoxy resin 19 for semiconductor encapsulation, to thereby produce the lamp 10. According to the present invention, a small-sized LED (size: about 200 μm×200 μm to about 300 μm×300 μm) can be readily formed from the stacked layer structure including the cladding layer 103 formed of a layer of a boron-containing Group III–V compound semiconductor having a {110} crystal plane, by means of cleavage along a {110} crystal orientation. Therefore, the small-sized light-emitting diode lamp 10 can be produced, which is particularly suitable for use in, for example, a display apparatus which requires a narrow installation space.

Next, a light source unit including the aforementioned LED chip or resin-encapsulated diode lamp 10 will be described. For example, a light source unit which is operated at constant voltage can be formed through parallel connection of a plurality of the lamps 10. Meanwhile, a light source unit which is operated at a constant current can be formed through series connection of a plurality of the lamps 10. The light source unit including the lamp 10 formed from the LED is particularly useful as a cold light source, since the light source unit releases small amounts of heat upon lighting, unlike the case of a conventional light source unit employing an incandescent lamp. For example, the light source unit can be employed for displaying frozen foods. Alternatively, the light source unit can be suitably employed in, for example, outdoor display apparatuses, traffic lights, automobile turn indicators, and illumination apparatuses.

EXAMPLES

The present invention will be described in detail with reference to the Examples, which should not be construed as limiting the present invention.

Example 1

The present invention will next be described in detail with reference to the following specific embodiment, in which an LED is produced from a stacked layer structure including a light-emitting layer of quantum well structure including a barrier layer formed from boron phosphide (BP) and a well layer formed from gallium indium nitride ($Ga_xIn_{1-x}N$: $0 \leq X \leq 1$).

Figure 3:
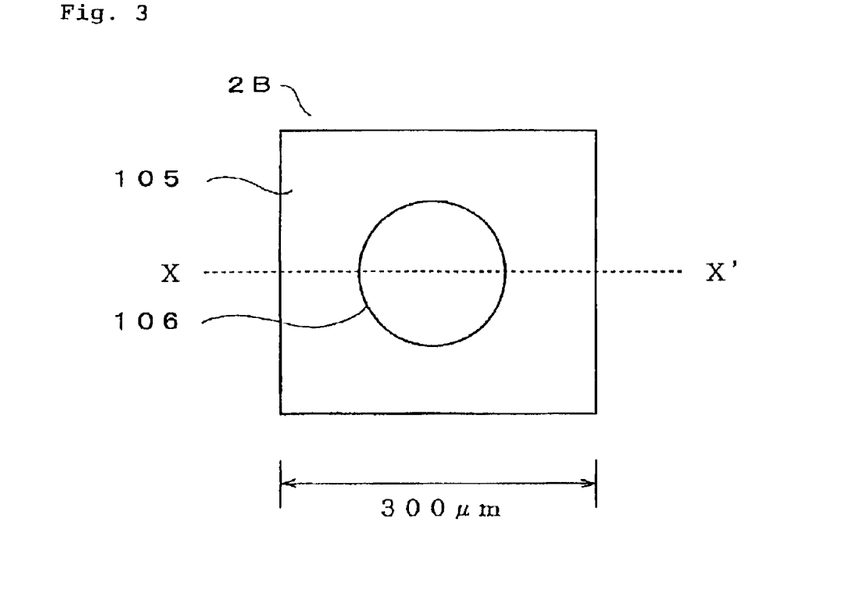
FIG. 3 is a schematic plan view showing an LED of Example 1.
Figure 4:
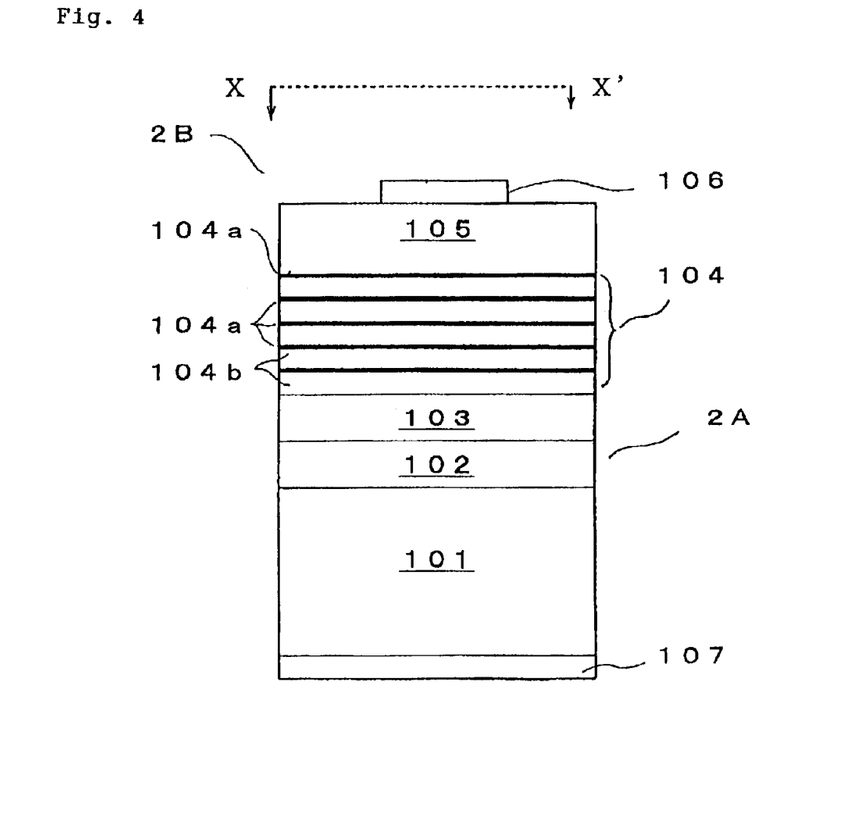
FIG. 4 is a schematic cross-sectional view of the LED shown in FIG. 3 taken along broken line X—X'.

FIG. 3 shows a schematic plan view of an LED 2B of Example 1. FIG. 4 shows a schematic cross-sectional view of the LED 2B shown in FIG. 3 taken along broken line X—X'. Common structural elements constituting the stacked layer structure 1A shown in FIG. 1 and a stacked layer structure 2A shown in FIGS. 3 and 4 are denoted by the same reference numerals.

In the stacked layer structure 2A for the LED 2B, a substrate 101 was formed from boron (B)-doped p-type single crystal Si having a (111) plane. On the substrate 101 was formed a boron phosphide buffer layer 102 (thickness: 5 nm) predominantly containing an amorphous structure in an as-grown state. The buffer layer 102 was formed from triethylboran (($C_2H_5)_3B$)/phosphine ($PH_3$)/hydrogen ($H_2$) through a MOCVD method under atmospheric pressure at 350° C.

On the surface of the buffer layer 102, a cladding layer 103 (thickness: 700 nm) containing a magnesium (Mg)-doped p-type boron phosphide (BP) layer was formed through the aforementioned MOCVD method at 850° C. Bis(cyclopentadienyl)magnesium (bis($C_5H_5)_2Mg$) was employed as a magnesium doping source. The carrier concentration of the p-type BP layer constituting the cladding layer 103 was regulated to $8 \times 10^{18}$ cm$^{-3}$. Since the p-type BP layer constituting the cladding layer 103 was formed on the buffer layer 102 serving as an underlying layer, the BP layer was found to contain a {110} crystal plane oriented substantially parallel to the surface of the substrate 101, to have no cracking, and to exhibit continuity. The band gap of the cladding layer 103 at room temperature was found to be about 3.0 eV.

On the surface of the cladding layer 103, a barrier layer 104b (thickness: 35 nm) containing undoped n-type boron monophosphide (BP, lattice constant: about 4.538 Å) was formed through the aforementioned MOCVD method at 850° C. The boron phosphide layer constituting the barrier layer 104b was formed under the following conditions: V/III ratio (i.e., the feed ratio of $PH_3$ to ($C_2H_5)_3B$): 30, growth rate: 20 nm/minute. Therefore, the band gap of the barrier layer 104b was found to be about 3.0 eV at room temperature, as in the case of the cladding layer 103. On the surface of the barrier layer 104b was formed a well layer 104a (thickness: 10 nm) containing undoped n-type gallium indium nitride ($Ga_{0.90}In_{0.10}N$, lattice constant: about 4.538 Å). The well layer 104a was formed from trimethylgallium (($CH_3)_3Ga$)/trimethylindium (($CH_3)_3In$)/ammonia ($NH_3$)/$H_2$ through a MOCVD method under atmospheric pressure at 850° C. A stacking unit including the barrier layer 104b and the well layer 104a was stacked repeatedly (number of periodic stacking cycles: 5), to thereby form a light-emitting layer 104 of multi quantum well structure.

An upper cladding layer 105 (thickness: 280 nm) containing a silicon (Si)-doped n-type boron phosphide (BP, lattice constant: about 4.538 Å) was formed on the top surface of the light-emitting layer 104; i.e., on the n-type well layer 104a. The carrier concentration of the upper cladding layer 105 was regulated to $3 \times 10^{18}$ cm$^{-3}$. The upper cladding layer 105 was formed from boron monophosphide having a band gap of about 3.0 eV at room temperature, as in the cases of the cladding layer 103 and the barrier layer 104b. A light-emitting part of lattice-matching double hetero (DH) junction structure was formed of the cladding layer 103; the light-emitting layer 104, which establishes lattice matching with the cladding layer 103 and which includes the well layer 104a and the barrier layer 104b; and the upper cladding layer 105.

A circular n-type top ohmic electrode 106 (diameter: 120 μm) was formed on the surface of the upper cladding layer 105. The top ohmic electrode 106 was formed from gold (Au)-germanium (Ge) alloy vacuum deposition film. A p-type bottom ohmic electrode 107 was formed on almost the entire bottom surface of the p-type Si substrate 101, to thereby produce the LED 2B. The bottom ohmic electrode 107 was formed from aluminum (Al) vacuum deposition film. The LED 2B was subjected to cutting in directions parallel to and perpendicular to the orientation of a [211] plane of the single crystal Si substrate 101, and a square LED 2B chip with a size of about 300 μm×about 300 μm was formed.

When an operation current of 20 mA was applied to the top ohmic electrode 106 and the bottom ohmic electrode 107 in a forward direction, light having a central emission wavelength of 407 nm was emitted. The full width at half maximum (FWHM) of the spectrum of the emitted light was found to be 12 nm; i.e., the emitted light exhibited high monochromaticity. The luminance of the LED 2B chip was measured by use of a typical integrating sphere, and was found to be 7 mcd; i.e., the LED 2B exhibited high emission intensity. In Example 1, the light-emitting layer 104 was formed on the cladding layer 103 (i.e., underlying layer) exhibiting excellent continuity, the layer 103 being provided on the buffer layer 102. Therefore, the light-emitting layer 104 exhibited excellent continuity, and, by virtue of the continuity, light of virtually uniform intensity was emitted from the entire surface of the light-emitting layer 104. Forward voltage (i.e., Vf) was measured on the basis of I–V characteristics, and found to be 3.6 V (forward current=20 mA). Reverse voltage was found to be 6 V (reverse current= 10 μA). Therefore, the LED exhibited high breakdown voltage.

Example 2

The present invention will next be described in detail with reference to the following specific embodiment, in which a short-wavelength visible LED is produced from a stacked layer structure including a light-emitting layer of quantum well structure including a barrier layer formed from boron indium phosphide ($B_XIn_{1-X}P$: $0 \leq X \leq 1$) and a well layer gallium nitride phosphide ($GaN_{1-X}P_X$: $0 \leq X \leq 1$).

Figure 5:
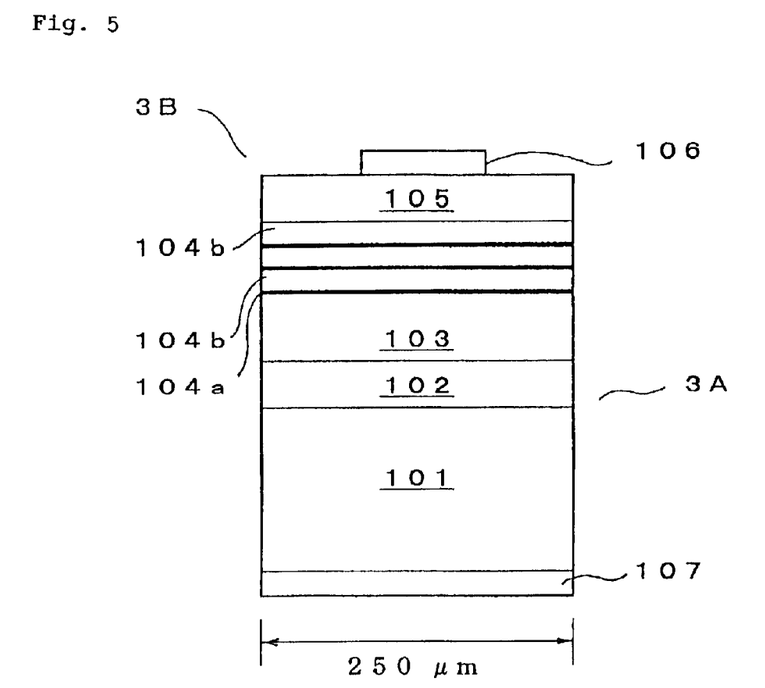
FIG. 5 is a schematic cross-sectional view showing an LED of Example 2.

FIG. 5 shows a schematic cross-sectional view of an LED 3B of Example 2. Common structural elements constituting the stacked layer structure 1A shown in FIG. 1 and a stacked layer structure 3A shown in FIG. 5 are denoted by the same reference numerals. In the stacked layer structure 3A for the LED 3B, a substrate 101 was formed from antimony (Sb)-doped n-type single crystal Si having a (100) plane. On the substrate 101 was formed an undoped n-type boron indium phosphide ($B_XIn_{1-X}P$) buffer layer 102 (thickness: 12 nm). The buffer layer 102 was formed from $(C_2H_5)_3B/(CH_3)_3In/PH_3/H_2$ through an MOCVD method under atmospheric pressure at 400° C. The boron compositional proportion (X) of mixed crystal $B_XIn_{1-X}P$ constituting the buffer layer 102 was regulated to 0.33 so as to attain the same lattice constant as Si (about 5.431 Å).

A cladding layer 103 was formed on the surface of the buffer layer 102. The cladding layer 103 was formed of a silicon (Si)-doped n-type $B_XIn_{1-X}P$ composition-graduated layer. The composition-graduated layer in which the boron (B) compositional proportion (X) was graduated was formed through the aforementioned atmospheric-pressure MOCVD method at 850° C. In the composition-graduated layer constituting the cladding layer 103, the boron compositional proportion (X) of $B_XIn_{1-X}P$ was regulated to 0.33 at the surface joined to the buffer layer 102, and the boron compositional proportion (X) was regulated to 0.99 at the surface joined to a well layer 104a constituting a light-emitting layer 104 having a quantum well structure. The boron compositional proportion (X) was increased proportionally until the thickness of the composition-graduated layer reached 500 nm. The average carrier concentration of the composition-graduated layer constituting the cladding layer 103 was regulated to $3 \times 10^{18}$ cm$^{-3}$. The $B_XIn_{1-X}P$ composition-graduated layer was formed under the following conditions: growth rate: 30 nm/minute, source material feed ratio (V/III ratio=$PH_3/((CH_3)_3Ga+(CH_3)_3In)$): 40. Therefore, the surface of the cladding layer 103 that faces the light-emitting layer 104 was found to have a band gap of 3.0 eV at room temperature.

On the cladding layer 103 was formed a silicon (Si)-doped n-type gallium indium nitride ($Ga_XIn_{1-X}N$: $0 \leq X \leq 1$) well layer 104a (thickness: 12 nm) predominantly containing a cubic structure. The well layer 104a was formed from $Ga_{0.90}In_{0.10}N$ having the same lattice constant as $B_{0.99}In_{0.01}P$ (lattice constant: about 4.557 Å) constituting the surface of the cladding layer 103. Since the well layer 104a was formed at 800° C.; i.e., a temperature lower than the temperature at which the cladding layer 103 was formed, thermal degradation of the cladding layer 103 did not occur. A barrier layer 104b (thickness: 45 nm) was formed so as to be joined to the well layer 104a. The barrier layer 104b was formed from n-type $B_{0.98}Ga_{0.02}P$ having the same lattice constant as $Ga_{0.90}In_{0.10}N$ constituting the well layer 104a (i.e., 4.557 Å) and predominantly containing a cubic structure. A stacking unit including the barrier layer 104b and the well layer 104a, which are in lattice matching with each other, was stacked repeatedly (number of periodic stacking cycles: 3), to thereby form a light-emitting layer 104 having a quantum well structure.

An upper cladding layer 105 (thickness: 250 nm) containing a magnesium (Mg)-doped p-type boron indium phosphide mixed crystal ($B_{0.99}In_{0.01}P$) was formed on the top surface of the light-emitting layer 104; i.e., on the barrier layer 104b. The upper cladding layer 105 was formed through the aforementioned atmospheric-pressure MOCVD method at 800° C. The carrier concentration of the upper cladding layer 105 was adjusted to $6 \times 10^{18}$ cm$^{-3}$. Since the upper cladding layer 105 was formed of a $B_{0.99}In_{0.01}P$ layer which establishes lattice matching with the well layer 104a and the barrier layer 104b constituting the light-emitting layer 104, mechanical and thermal strain applied to the light-emitting layer 104 was reduced, and the light-emitting layer 104 maintained good crystallinity.

A circular p-type top ohmic electrode 106 (diameter: 120 μm) was formed on the surface of the upper cladding layer 105. The top ohmic electrode 106 was formed from gold (Au)-zinc (Zn) alloy vacuum deposition film. An n-type bottom ohmic electrode 107 was formed on almost the entire bottom surface of the n-type Si substrate 101, to thereby produce the LED 3B. The bottom ohmic electrode 107 was formed from aluminum (Al) vacuum deposition film. The LED 3B was subjected to cutting in directions parallel to and perpendicular to the orientation of a [110] plane of the single crystal Si substrate 101, and a square LED 3B chip with a size of about 250 μm×about 250 μm was formed.

When an operation current of 20 mA was applied to the top ohmic electrode 106 and the bottom ohmic electrode 107 in a forward direction, light having a central emission wavelength of 430 nm was emitted. The full width at half maximum (FWHM) of the spectrum of the emitted light was found to be 14 nm; i.e., the emitted light exhibited high monochromaticity. The luminance of the LED 3B chip was measured by use of a typical integrating sphere, and was found to be 8 mcd; i.e., the LED 3B exhibited high emission intensity. In addition, near-visible emission pattern images revealed that the LED 3B emits light of virtually uniform intensity from the entire surface of the light-emitting layer 104, based on the effect of the upper cladding layer 105 as an emission transmission layer having a large band gap. Forward voltage (i.e., Vf) was measured on the basis of I–V characteristics, and found to be 3.4 V (forward current=20 mA). Reverse voltage was found to be 7 V (reverse current= 10 μA). Therefore, the LED 3B with high breakdown voltage was produced.

Example 3

The present invention will next be described in detail with reference to the following specific embodiment, in which a short-wavelength visible LED is produced from a stacked layer structure including a cladding layer formed from boron indium phosphide ($B_XIn_{1-X}P$: $0 \leq X \leq 1$) and an intermediate layer provided on the cladding layer.

Figure 6:
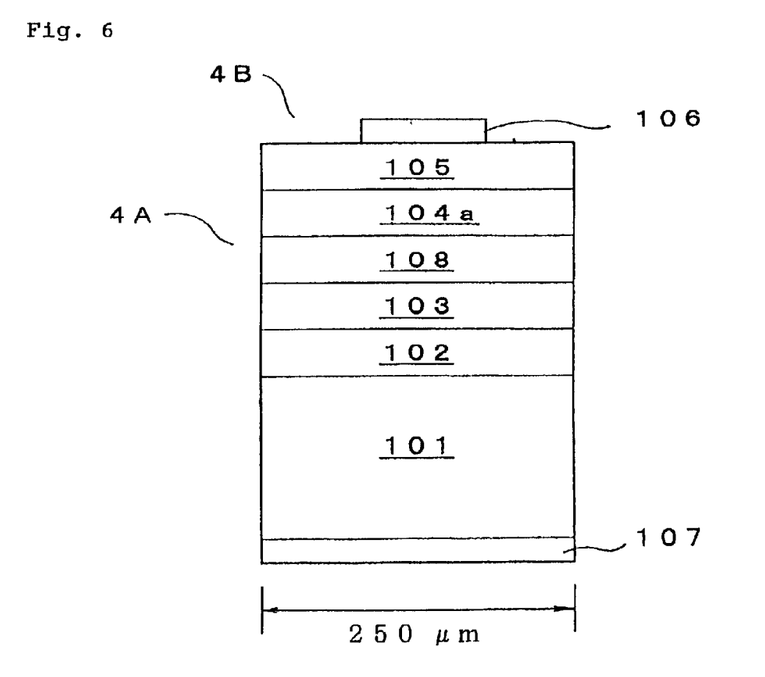
FIG. 6 is a schematic cross-sectional view showing an LED of Example 3.

FIG. 6 shows a schematic cross-sectional view of an LED 4B of Example 3. Structural elements common to those of the stacked layer structure 1A shown in FIG. 1 are denoted by the same reference numerals in FIG. 6. In the stacked layer structure 4A for the LED 4B, a substrate 101 was formed from antimony (Sb)-doped n-type single crystal Si having a (100) plane. On the substrate 101 was formed an undoped n-type boron indium phosphide ($B_xIn_{1-x}P$) buffer layer 102 (thickness: 12 nm). The buffer layer 102 was formed from $(C_2H_5)_3B$/trimethylindium $((CH_3)_3In)/PH_3/H_2$ through an MOCVD method under atmospheric pressure at 400° C. The boron compositional proportion (X) of mixed crystal $B_xIn_{1-x}P$ constituting the buffer layer 102 was adjusted to 0.33 so as to attain the same lattice constant as Si (about 5.431 Å).

On the surface of the buffer layer 102, a cladding layer 103 containing n-type mixed crystal $B_xIn_{1-x}P$ was formed through the aforementioned atmospheric-pressure MOCVD method at 850° C. The cladding layer 103 was formed of a $B_xIn_{1-x}P$ composition-graduated layer, in which the boron compositional proportion (X) is graduated such that the boron compositional proportion (X) of $B_xIn_{1-x}P$ was adjusted to 0.33 at the surface joined to the buffer layer 102, and the boron compositional proportion (X) was adjusted to 0.99 at the surface joined to an intermediate layer 108. The boron compositional proportion (X) was increased proportionally until the thickness of the composition-graduated layer reached 600 nm. The average carrier concentration of the cladding layer 103 was adjusted to $3 \times 10^{18}$ cm$^{-3}$. The $B_xIn_{1-x}P$ composition-graduated layer was formed under the following conditions: growth rate: 30 nm/minute, source material feed ratio (V/III ratio=$PH_3/((CH_3)_3Ga+(CH_3)_3In)$): 45. Therefore, the surface of the cladding layer 103 that faces the light-emitting layer 104 was found to have a band gap of about 3.0 eV at room temperature.

A silicon (Si)-doped n-type intermediate layer 108 (thickness: about 2 nm) was formed on the cladding layer 103. Since the intermediate layer 108 was formed at 800° C.; i.e., a temperature lower than the temperature at which the cladding layer 103 was formed, thermal degradation of the cladding layer 103 was effectively prevented. The intermediate layer 108 was formed from $Ga_{0.90}In_{0.10}N$ having the same lattice constant as $B_{0.99}In_{0.01}P$ (lattice constant: 4.557 Å) constituting the surface (on the intermediate layer 108 side) of the cladding layer 103. Disilane ($Si_2H_6$) was employed as a silicon doping source of the intermediate layer 108. The carrier concentration of the intermediate layer 108 was adjusted to $1 \times 10^{17}$ cm$^{-3}$. Since the intermediate layer 108 was formed on the cladding layer 103 which serves as an underlying layer and exhibits continuity under the effect of the buffer layer 102, and the intermediate layer 108 was formed from a semiconductor material capable of establishing lattice matching with the cladding layer 103, the intermediate layer 108 exhibited particularly excellent continuity.

A well layer 104a (thickness: about 10 nm) was formed on the surface of the intermediate layer 108 through an atmospheric-pressure MOCVD method at 800° C. The well layer 104a was formed from n-type gallium indium nitride ($Ga_{0.90}In_{0.10}N$), which is the same material as the intermediate layer 108. The carrier concentration of the well layer 104a was adjusted to $2 \times 10^{18}$ cm$^{-3}$. Since the well layer 104a was formed from the same material as that constituting the intermediate layer 108, and the well layer 104a was formed so as to be joined to the intermediate layer 108 which establishes lattice matching with the well layer 104a, the well layer 104a formed of a Group III nitride semiconductor layer exhibited particularly excellent continuity.

An upper cladding layer 105 (thickness: 250 nm) containing a p-type boron indium phosphide mixed crystal ($B_{0.99}In_{0.01}P$) was formed on the surface of the well layer 104a. The upper cladding layer 105 was formed through the aforementioned atmospheric-pressure MOCVD method at 800° C. The carrier concentration of the upper cladding layer 105 was adjusted to $2 \times 10^{18}$ cm$^{-3}$. Since the upper cladding layer 105 was formed of a boron-containing Group III–V compound semiconductor layer which establishes lattice matching with the well layer 104a, mechanical and thermal strain applied to the well layer 104a was reduced, and the well layer 104a maintained good crystallinity by virtue of lattice matching with the intermediate layer 108.

A circular p-type top ohmic electrode 106 (diameter: 120 μm) was formed on the surface of a single quantum well structure including the lower cladding layer 103, the intermediate layer 108, the well layer 104a, and the upper cladding layer 105. The top ohmic electrode 106 was formed from gold (Au)-zinc (Zn) alloy vacuum deposition film. An n-type bottom ohmic electrode 107 was formed on almost the entire bottom surface of the n-type Si substrate 101, to thereby produce the LED 4B. The bottom ohmic electrode 107 was formed from aluminum (Al) vacuum deposition film. The LED 4B was subjected to cutting in directions parallel to and perpendicular to the orientation of a [110] plane of the single crystal Si substrate 101, and a square LED 4B chip with a size of 250 μm×250 μm was formed.

When an operation current of 20 mA was applied to the light-emitting section of the single quantum well structure in a forward direction through the electrodes 106 and 107, light having a central emission wavelength of about 430 nm was emitted. The luminance of the LED 4B chip was measured by use of a typical integrating sphere, and was found to be 7 mcd; i.e., the LED 4B exhibited high emission intensity. In addition, near-visible emission pattern images revealed that, as compared with the case of the LED 3B of Example 2, the LED 4B emits light of virtually uniform intensity from the entire surface of the light-emitting section, based on the effect of the upper cladding layer 105 as an emission transmission layer having a large band gap. Forward voltage (i.e., Vf) was measured on the basis of I–V characteristics, and found to be 3.8 V (forward current=20 mA). Reverse voltage was found to be 8 V (reverse current=10 μA). Therefore, the LED 4B with high breakdown voltage was produced.

While the invention has been described in detail and with reference to specific embodiments thereof, it will be apparent to one skilled in the art that various changes and modifications can be made therein without departing from the spirit and scope thereof.

What is claimed is:

1. A stacked layer structure comprising a single crystal substrate; an amorphous or polycrystalline buffer layer formed from a boron-containing Group III–V compound semiconductor provided on the substrate; a cladding layer formed from a boron-containing Group III–V compound semiconductor provided on the buffer layer; and a light-emitting layer having a quantum well structure including a barrier layer formed from a boron-containing Group III–V compound semiconductor and a well layer formed from a Group III nitride semiconductor provided on the cladding layer, wherein the barrier layer is formed from a boron-containing Group III–V compound semiconductor having the same lattice constant as a boron-containing Group III–V compound semiconductor constituting the cladding layer.

2. The stacked layer structure as claimed in claim 1, wherein the well layer is formed from a Group III nitride semiconductor having the same lattice constant as a boron-containing Group III–V compound semiconductor constituting the cladding layer.

3. The stacked layer structure as claimed in claim 1, wherein the well layer is formed from a semiconductor having the same lattice constant as a semiconductor constituting the barrier layer.

4. The stacked layer structure as claimed in claim 1, wherein the barrier layer is formed from boron gallium indium phosphide ($B_X Ga_Y In_{1-X-Y} P$: $0 < X \leq 1, 0 \leq Y < 1, 0 < X+Y \leq 1$).

5. The stacked layer structure as claimed in claim 1, wherein the buffer layer is formed from a boron-containing Group III–V compound semiconductor having a composition capable of establishing lattice matching with a single crystal material constituting the substrate.

6. The stacked layer structure as claimed in claim 1, wherein the cladding layer is formed of a boron-containing Group III–V compound semiconductor layer, the cladding layer having a first surface that faces the buffer layer having a boron composition capable of establishing lattice matching with the buffer layer, and a second surface that faces the light-emitting layer having a boron composition capable of establishing lattice matching with the barrier layer or the well layer, wherein a boron composition is graduated in a thickness direction of the cladding layer.

7. The stacked layer structure as claimed in claim 6, wherein the cladding layer is formed from boron gallium indium phosphide ($B_X Ga_Y In_{1-X-Y} P$: $0 < X \leq 1, 0 \leq Y < 1, 0 < X+Y \leq 1$).

8. The stacked layer structure as claimed in claim 1, wherein an intermediate layer formed from a Group III–V compound semiconductor is provided between the cladding layer and the light-emitting layer, and wherein the semiconductor of the intermediate layer contains an element which constitutes the Group III–V compound semiconductor of the light-emitting layer.

9. The stacked layer structure as claimed in claim 8, wherein the intermediate layer is formed from a Group III–V compound semiconductor capable of establishing lattice matching with a Group III–V compound semiconductor constituting the light-emitting layer.

10. The stacked layer structure as claimed in claim 9, wherein the intermediate layer is formed from the same Group III–V compound semiconductor as that constituting the light-emitting layer.

11. A light-emitting device comprising the stacked layer structure as claimed in claim 1.

12. A lamp comprising the light-emitting device as claimed in claim 11.

13. A light source unit comprising the lamp as claimed in claim 12.

* * * * *